(12) United States Patent
Hayashi et al.

(10) Patent No.: US 10,375,763 B2
(45) Date of Patent: Aug. 6, 2019

(54) TEMPERATURE CONTROL APPARATUS, TEMPERATURE CONTROL METHOD AND RECORDING MEDIUM

(71) Applicant: TOKYO ELECTRON LIMITED, Tokyo (JP)

(72) Inventors: Daisuke Hayashi, Miyagi (JP); Masato Takayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 496 days.

(21) Appl. No.: 15/090,879

(22) Filed: Apr. 5, 2016

(65) Prior Publication Data

US 2016/0302258 A1 Oct. 13, 2016

(30) Foreign Application Priority Data

Apr. 7, 2015 (JP) .................. 2015-078548

(51) Int. Cl.
*H05B 1/02* (2006.01)
*H05B 3/14* (2006.01)
(Continued)

(52) U.S. Cl.
CPC ....... *H05B 1/0233* (2013.01); *F27B 17/0025* (2013.01); *F27D 21/0014* (2013.01);
(Continued)

(58) Field of Classification Search
CPC .... H05B 1/0233; H05B 1/0202; H05B 3/143; H01L 21/6833; H01L 21/67248; H01L 21/67109; H01L 21/67103; F27B 17/0025
See application file for complete search history.

(56) References Cited

U.S. PATENT DOCUMENTS 8,092,637 B2 * 1/2012 Kouzuma ......... H01L 21/67248
156/345.24
8,150,242 B2 * 4/2012 Merry ................... C23C 16/481
392/407
(Continued)

FOREIGN PATENT DOCUMENTS

JP H06-177141 A 6/1994
JP 2009-238773 A 10/2009

*Primary Examiner* — Jennifer E Simmons
*Assistant Examiner* — Leo T Hinze
(74) *Attorney, Agent, or Firm* — Brundidge & Stanger, P.C.

(57) ABSTRACT

A processing system includes a thermo viewer 51 which measures a temperature distribution over a top surface of a semiconductor wafer; a temperature measuring device 14 which measures, for each of divided areas of the semiconductor wafer, a temperature of a portion in the divided area; a median value calculating unit 202 which calculates, for each divided area, a median value of a temperature distribution of the divided area, based on the temperature distribution measured by the thermo viewer 51; an offset calculating unit 204 which calculates, for each divided area, a difference between the median value and the temperature of the portion as an offset; and a temperature control unit 205 which controls, for each divided area, the temperature of the divided area such that the median value becomes equal to a set temperature, based on the offset and the temperature measured by the temperature measuring device 14.

19 Claims, 10 Drawing Sheets

(51) Int. Cl.
*F27B 17/00* (2006.01)
*H01L 21/67* (2006.01)
*H01L 21/683* (2006.01)
*F27D 21/00* (2006.01)

(52) U.S. Cl.
CPC .. *H01L 21/67109* (2013.01); *H01L 21/67248* (2013.01); *H01L 21/6831* (2013.01); *H05B 3/143* (2013.01)

(56) References Cited

U.S. PATENT DOCUMENTS

| | | | |
|---|---|---|---|
| 2008/0170969 A1* | 7/2008 | Yoshioka | H01L 21/67109 422/109 |
| 2010/0111511 A1 | 5/2010 | Merry et al. | |
| 2011/0181313 A1* | 7/2011 | Sasaki | H01L 21/67109 324/750.03 |

* cited by examiner

TEMPERATURE CONTROL APPARATUS, TEMPERATURE CONTROL METHOD AND RECORDING MEDIUM

CROSS-REFERENCE TO RELATED APPLICATION

This application claims the benefit of Japanese Patent Application No. 2015-078548 filed on Apr. 7, 2015, the entire disclosures of which are incorporated herein by reference.

TECHNICAL FIELD

The embodiments described herein pertain generally to a temperature control apparatus, a temperature control method and a recording medium.

BACKGROUND

In a manufacturing process of a semiconductor device, a temperature of a semiconductor wafer as a processing target object is one of important factors that determine a characteristic of the semiconductor device. Thus, in the manufacturing process, the temperature of the semiconductor wafer needs to be controlled with high precision. Further, in the manufacturing process, there may be generated a non-uniform temperature distribution on the semiconductor wafer due to such factors as a temperature or a pressure of a processing gas, a flow of the processing gas, and the like. The non-uniform temperature distribution of the semiconductor wafer may result in generation of non-uniformity in the characteristic of the semiconductor device which is manufactured by using the processed semiconductor wafer.

To suppress this problem, there has been proposed a technique in which a distance between a semiconductor wafer and a heating stage provided at a rear surface side of the semiconductor wafer is adjusted by controlling, for example, a protruding amount of supporting pins configured to support the semiconductor wafer, so that a temperature distribution of the semiconductor wafer is controlled (see, for example, Patent Document 1). Further, there is also known a technique in which a mounting surface for a semiconductor wafer is divided into multiple heating areas, a temperature of a surface of the semiconductor wafer is measured from above the semiconductor wafer by using a thermography unit, and temperatures of the heating areas are individually controlled such that an average temperature of each heating area reaches a target temperature (see, for example, Patent Document 2).

Patent Document 1: Japanese Patent Laid-open Publication No. H06-177141

Patent Document 2: Japanese Patent Laid-open Publication No. 2009-238773

In the technique of controlling the temperature distribution of the semiconductor wafer by adjusting the protruding amount of the supporting pins, however, although it is possible to suppress the non-uniform temperature distribution of the semiconductor wafer, the effect is very limiting. Further, in the technique of controlling the temperatures of the heating areas individually such that the average temperature of each heating area becomes equal to the target temperature based on the temperature of the surface of the semiconductor wafer measured by the thermography unit, although the average temperature of each heating area can be controlled to reach the target temperature, the non-uniformity in the temperature distribution on the semiconductor wafer may not necessarily be decreased but rather increased.

SUMMARY

In one exemplary embodiment, a temperature control apparatus of controlling a temperature of a processing target object includes a first temperature measurement unit, a second temperature measurement unit, a median value calculating unit, an offset calculating unit and a temperature control unit. The first temperature measurement unit is configured to measure a temperature distribution over an entire top surface of the processing target object. The second temperature measurement unit is configured to measure, for each of preset divided areas into which the top surface of the processing target object is divided, a temperature of a portion in the divided area. The median value calculating unit is configured to calculate, for each divided area, a median value of a temperature distribution of the divided area, based on the temperature distribution over the entire top surface of the processing target object measured by the first temperature measurement unit. The offset calculating unit is configured to calculate, for each divided area, a difference between the median value and the temperature of the top surface of the processing target object in the portion, whose temperature is measured by the second temperature measurement unit, as an offset. The temperature control unit is configured to control, for each divided area, the temperature of the divided area such that the median value becomes equal to a set temperature, based on the offset and the temperature measured by the second temperature measurement unit.

According to the exemplary embodiment, a temperature control apparatus includes a first temperature measurement unit, a second temperature measurement unit, a median value calculating unit, an offset calculating unit and a temperature control unit. The first temperature measurement unit is configured to measure a temperature distribution over an entire top surface of the processing target object. The second temperature measurement unit is configured to measure, for each of preset divided areas into which the top surface of the processing target object is divided, a temperature of a portion in the divided area. The median value calculating unit is configured to calculate, for each divided area, a median value of a temperature distribution of the divided area, based on the temperature distribution over the entire top surface of the processing target object measured by the first temperature measurement unit. The offset calculating unit is configured to calculate, for each divided area, a difference between the median value and the temperature of the top surface of the processing target object in the portion, whose temperature is measured by the second temperature measurement unit, as an offset. The temperature control unit is configured to control, for each divided area, the temperature of the divided area such that the median value becomes equal to a set temperature, based on the offset and the temperature measured by the second temperature measurement unit.

The first temperature measurement unit may be configured to measure, as the temperature distribution over the entire top surface of the processing target object, a temperature distribution of an entire area in a mounting surface of a mounting table on which the processing target object is mounted.

The mounting table may be configured to mount the processing target object thereon, and may comprise an electrostatic attraction unit configured to attract and hold the processing target object by an electrostatic force.

The temperature control unit may be configured to control, for each divided area, the temperature of the divided area such that a temperature calculated by adding the offset to the temperature measured by the second temperature measurement unit becomes equal to the set temperature.

The temperature control unit may be configured to control, for each divided area, the temperature of the divided area such that the temperature measured by the second temperature measurement unit becomes equal to a temperature calculated by subtracting the offset from the set temperature.

The first temperature measurement unit may be configured to divide the top surface of the processing target object into minute areas smaller than the divided areas and configured to measure a temperature of each minute area, based on an intensity of light having a preset wavelength range radiated from the minute area.

Each minute area may have a size equal to or less than 1 mm square on the top surface of the processing target object.

The first temperature measurement unit may be allowed to measure a temperature of a preset range within a temperature range from −50° C. to +400° C.

The second temperature measurement unit may be implemented by a thermocouple.

The first temperature measurement unit and the second temperature measurement unit may have a temperature measurement resolution of 0.1° C. or less.

The temperature control unit may have a temperature control resolution of 0.1° C. or less.

In another exemplary embodiment, a temperature control method of controlling a temperature of a processing target object includes measuring a temperature distribution over an entire top surface of the processing target object; measuring, for each of preset divided areas into which the top surface of the processing target object is divided, a temperature of a portion in the divided area; calculating, for each divided area, a median value of a temperature distribution of the divided area, based on the temperature distribution over the entire top surface of the processing target object; calculating, for each divided area, a difference between the median value and the temperature of the top surface of the processing target object in the portion, whose temperature is measured in the measuring of the temperature of the portion, as an offset; and controlling, for each divided area, the temperature of the divided area such that the median value becomes equal to a set temperature, based on the offset and the temperature measured in the measuring of the temperature of the portion.

In yet another exemplary embodiment, a non-transitory computer-executable recording medium causes, in response to execution, a one or more processors to measure a temperature distribution over an entire top surface of a processing target object, which is measured by a first temperature measurement unit; measure, for each of preset divided areas into which the top surface of the processing target object is divided, a temperature of a portion in the divided area, which is measured by a second temperature measurement unit; calculate, for each divided area, a median value of a temperature distribution of the divided area, based on the temperature distribution over the entire top surface of the processing target object measured by the first temperature measurement unit; calculate, for each divided area, a difference between the median value and the temperature of the top surface of the processing target object in the portion, whose temperature is measured by the second temperature measurement unit, as an offset; and output, for each divided area, an instruction to control the temperature of each divided area such that the median value becomes equal to a set temperature to a temperature control unit, based on the offset and the temperature measured by the second temperature measurement unit.

According to the exemplary embodiments, it is possible to improve temperature uniformity over a surface of the semiconductor wafer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
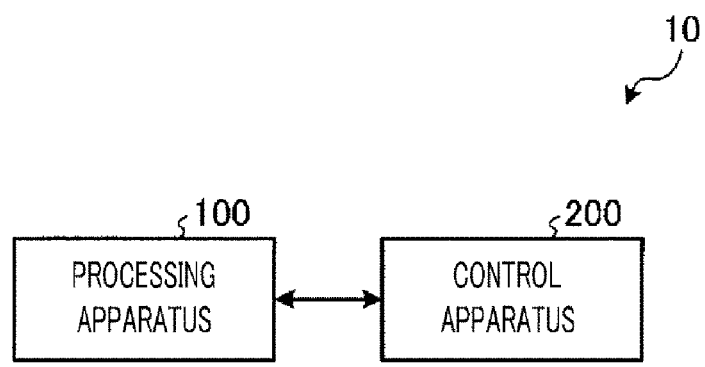
FIG. 1 is a diagram illustrating an example of a processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a temperature control apparatus, a temperature control method and a recording medium according to exemplary embodiments will be described in detail with reference to accompanying drawings, which form a part of the description. Here, however, it should be noted that the exemplary embodiments are not limiting. Furthermore, the various exemplary embodiments may be appropriately combined as long as their processing contents are not contradictory.

[Processing System 10]

FIG. 1 is a diagram illustrating an example of a processing system 10. The processing system 10 includes, as illustrated in FIG. 1, for example, a processing apparatus 100 and a control apparatus 200. The processing apparatus 100 is configured to perform a process such as a plasma etching process, a plasma CVD process or a heating process on a semiconductor wafer W. The control apparatus 200 is configured to control the processing apparatus 100 to perform a preset processing on the semiconductor wafer W which is carried into the processing apparatus 100, based on information sent from various kinds of sensors such as a temperature sensor provided in the processing apparatus 100. The control apparatus 200 is an example of a temperature control apparatus.

[Processing Apparatus 100]

Figure 2:
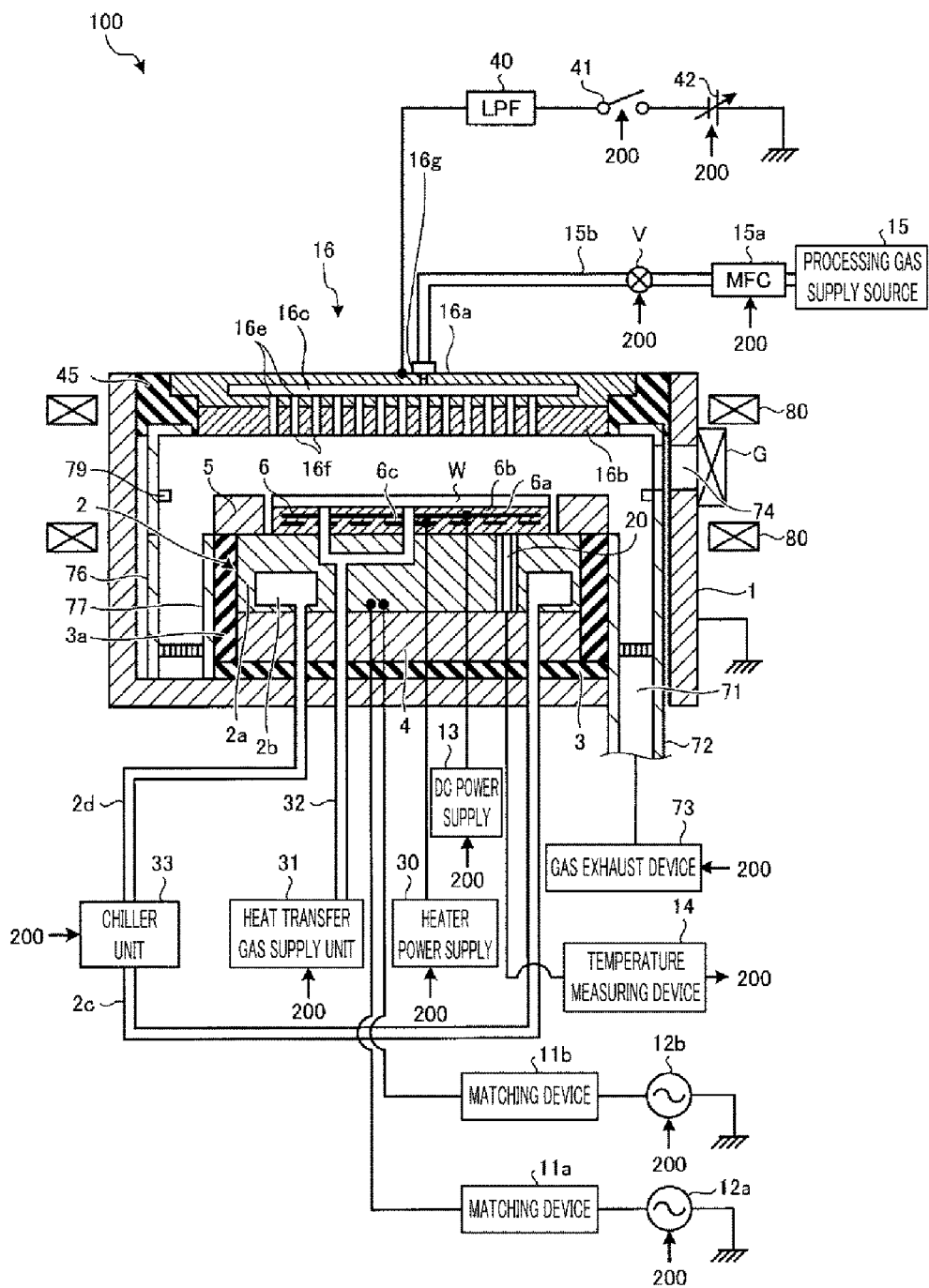
FIG. 2 is a cross sectional view illustrating an example of a processing apparatus.

FIG. 2 is a cross sectional view illustrating an example of the processing apparatus 100. The processing apparatus 100 includes a processing chamber 1 which is hermetically configured and electrically grounded, as shown in FIG. 2. The processing chamber 1 is formed of, for example, aluminum having an anodically oxidized surface and has a substantially cylindrical shape. A mounting table 2 configured to support the semiconductor wafer W as a processing target object thereon horizontally is provided within the processing chamber 1.

The mounting table 2 includes a base 2a made of a conductive metal, for example, aluminum or the like, and serves as a lower electrode. The mounting table 2 is supported on a conductive supporting table 4 with an insulating plate 3 therebetween. Further, a focus ring 5 formed of, by way of example, but not limitation, single-crystalline silicon is provided on a periphery portion of a top surface of the mounting table 2. Further, a cylindrical inner wall member 3a made of, for example, quartz is provided to surround the mounting table 2 and the supporting table 4.

A shower head 16 having a function as an upper electrode is provided above the mounting table 2, while facing the mounting table 2 substantially in parallel, i.e., while facing the semiconductor wafer W placed on the mounting table 2. The shower head 16 and the mounting table 2 serve as a pair of electrodes (upper electrode and lower electrode). The base 2a of the mounting table 2 is connected to a high frequency power supply 12a via a matching device 11a. Further, the base 2a of the mounting table 2 is also connected to a high frequency power supply 12b via a matching device 11b.

The high frequency power supply 12a is configured to supply a high frequency power of a preset frequency (e.g., 100 MHz) for plasma generation to the base 2a of the mounting table 2. Further, the high frequency power supply 12b is configured to supply a high frequency power of a predetermined frequency (e.g., 13 MHz) for ion attraction (bias) to the base 2a of the mounting table 2. The frequency of the high frequency power from the high frequency power supply 12b is lower than the frequency of the high frequency power from the high frequency power supply 12a. On/off operations of the high frequency power supplies 12a and 12b, the high frequency powers supplied by the high frequency power supplies 12a and 12b, and so forth are controlled by the control apparatus 200 to be described later.

An electrostatic chuck 6 configured to attract/hold and heat the semiconductor wafer W is provided on the top surface of the mounting table 2. The electrostatic chuck 6 includes an insulator 6b, and an electrode 6a and a heater 6c embedded in the insulator 6b. The electrode 6a is connected to a DC power supply 13. The heater 6c is connected to a heater power supply 30. A Coulomb force is generated in a surface of the electrostatic chuck 6 by a DC voltage applied from the DC power supply 13, and the electrostatic chuck 6 attracts and holds the semiconductor wafer W on a top surface thereof by the generated Coulomb force. An on/off operation of the DC power supply 13 is controlled by the control apparatus 200 to be described later.

Furthermore, the electrostatic chuck 6 is also configured to heat the semiconductor wafer W by the heater 6c which is heated by a power supplied from the heater power supply 30. The power supplied to the heater 6c from the heater power supply 30 is controlled by the control apparatus 200 to be described later. The top surface of the electrostatic chuck 6 is divided into a plurality of divided areas, and the heater 6c is provided in each of the divided areas. The electrostatic chuck 6 is an example of an electrostatic attraction unit.

A temperature sensor 20 is provided at a bottom surface of the electrostatic chuck 6, and the temperature sensor 20 is connected to a temperature measuring device 14. The temperature sensor 20 is provided in each of the divided areas. Each temperature sensor 20 is configured to detect information indicating a temperature of the electrostatic chuck 6 in each corresponding one of the divided areas and to output the detected information to the temperature measuring device 14. The temperature measuring device 14 is configured to measure the temperature of the electrostatic chuck 6 in each of the divided areas based on the information output from the temperature sensor 20, and output the measured temperature to the control apparatus 200.

A coolant path 2b through which a coolant flows is provided within the mounting table 2. The coolant path 2b is connected to a chiller unit 33 via pipelines 2c and 2d. A coolant such as Galden supplied from the chiller unit 33 is circulated through the coolant path 2b, so that the mounting table 2 is cooled. A temperature and a flow rate of the coolant supplied from the chiller unit 33 are controlled by the control apparatus 200 to be described later.

Further, the mounting table 2 is equipped with a pipeline 32 which penetrates through the mounting table 2 to supply a heat transfer gas (backside gas) such as a helium gas to a rear surface side of the semiconductor wafer W. The pipeline 32 is connected to a heat transfer gas supply unit 31. A flow rate of the heat transfer gas supplied toward the rear surface side of the semiconductor wafer W from the heat transfer gas supply unit 31 through the pipeline 32 is controlled by the control apparatus 200 to be described later.

The control apparatus 200 is configured to control the semiconductor wafer W held on the top surface of the electrostatic chuck 6 to have a preset temperature by controlling the cooling by the coolant flowing through the coolant path 2b, the heating by the heater 6c within the electrostatic chuck 6 and the flow rate of the heat transfer gas which adjusts the amounts of the heats transferred to the semiconductor wafer W.

The shower head 16 is provided at an upper portion of the processing chamber 1. The shower head 16 includes a main body 16a; and a ceiling plate 16b constituting an electrode plate. The shower head 16 is supported at the upper portion of the processing chamber 1 with an insulating member 45 therebetween. The main body 16a is formed of, by way of non-limiting example, aluminum having an anodically oxidized surface, and supports the ceiling plate 16b from above in a detachable manner.

A gas diffusion space 16c is formed within the main body 16a. Gas through holes 16e are formed in a bottom portion of the main body 16a to be located under the gas diffusion space 16c. The ceiling plate 16b is provided with a multiple number of gas discharge holes 16f, each of which is formed through the ceiling plate 16b in a thickness direction thereof. Each of the gas discharge holes 16f communicates with each corresponding one of the gas through holes 16e. With this configuration, a processing gas supplied into the gas diffusion space 16c is then discharged into the processing chamber 1 through the gas through holes 16e and gas discharge holes 16f while being diffused as in a shower device. Further, since the main body 16a or the like is also equipped with a temperature control mechanism such as a non-illustrated heater and a non-illustrated pipeline for circulating a coolant, the shower head 16 can be controlled to have a temperature within a required temperature range while processing the semiconductor wafer W.

The main body 16a has a gas inlet opening 16g through which the processing gas is introduced into the gas diffusion space 16c. One end of a pipeline 15b is connected to the gas inlet opening 16g, and the other end of the pipeline 16b is connected, via a valve V and a mass flow controller (MFC) 15a, to a processing gas supply source 15 configured to supply the processing gas for processing the semiconductor wafer W. The processing gas supplied from the processing gas supply source 15 is introduced into the gas diffusion space 16c through the pipeline 15b, and then, discharged into the processing chamber 1 through the gas through holes 16e and the gas discharge holes 16f by being diffused as in a shower device. The valve V and the MFC 15a are controlled by the control apparatus 200 to be described later.

The shower head 16 is electrically connected to a variable DC power supply 42 via a low pass filter (LPF) 40. A supply of a DC power from the variable DC power supply 42 and a stop of the supply of the DC power are regulated by a switch 42. An electric current and a voltage from the variable DC power supply 42 and an on/off operations of the switch 41 are controlled by the control apparatus 200 to be described later. By way of example, when plasma is generated in a processing space within the processing chamber 1 by supplying the high frequency powers to the mounting table 2 from the high frequency power supplies 12a and 12b, the switch 41 is turned on by the control apparatus 200, when necessary, and a preset DC voltage is applied to the shower head 16 serving as the upper electrode.

A gas exhaust opening 71 is formed in a bottom portion of the processing chamber 1. The gas exhaust opening 71 is connected to a gas exhaust device 73 via a gas exhaust pipe 72. The gas exhaust device 73 has a vacuum pump, and by operating this vacuum pump, the inside of the processing chamber 1 can be decompressed to a preset vacuum level. An exhausted gas flow rate by the gas exhaust device 73 or the like is controlled by the control apparatus 200 to be described later. Further, an opening 74 is provided at a sidewall of the processing chamber 1, and a gate valve G configured to open or close the opening 74 is provided at the opening 74.

A deposition shield 76 is detachably provided along an inner wall of the processing chamber 1. Further, a deposition shield 77 is provided to cover outer surfaces of the mounting table 2 serving as the lower electrode, the inner wall member 3a and the supporting table 4. The deposition shields 76 and 77 are configured to suppress an etching byproduct (deposit) from adhering to the inner wall of the processing chamber 1. Further, a conductive member (GND block) 79, which is DC-connected to the ground, is provided at a portion of the deposition shield 76 which is substantially level with a height position of the semiconductor wafer W held on the electrostatic chuck 6. The conductive member 79 serves to suppress occurrence of an abnormal electric discharge within the processing chamber 1.

Furthermore, ring magnets 80 are concentrically arranged around the processing chamber 1. The ring magnets 80 are configured to generate a magnetic field in a space between the shower head 16 and the mounting table 2. The ring magnets 80 are rotatably supported by a non-illustrated rotating device.

[Electrostatic Chuck 6]

Figure 3:
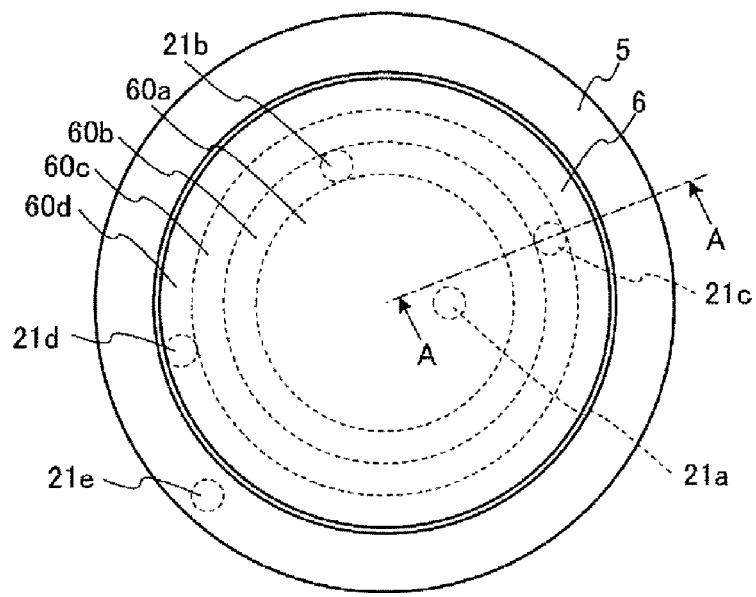
FIG. 3 is a diagram illustrating an example of a top surface of an electrostatic chuck.
Figure 4:
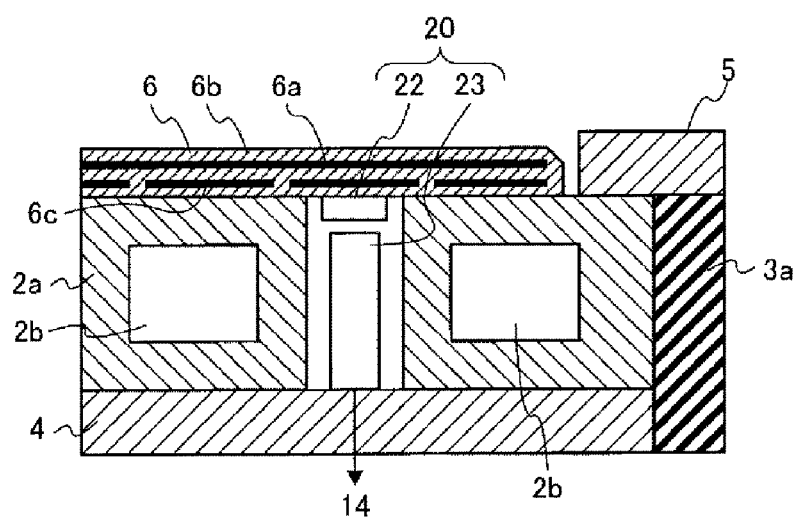
FIG. 4 is a diagram illustrating an example of a cross section taken along a line A-A of FIG. 3.

FIG. 3 is a diagram illustrating an example of the top surface of the electrostatic chuck 6. FIG. 4 is a diagram illustrating an example of a cross section taken along a line A-A of FIG. 3. A focus ring 5 is provided to surround the electrostatic chuck 6. The top surface of the electrostatic chuck 6 on which the semiconductor wafer W is mounted is divided into a multiple number of concentric divided areas 60a to 60d. In the following description, when it is not necessary to distinguish the divided areas 60a to 60d, they will be referred to as a "divided area 60" as a general term.

As depicted in FIG. 4, for example, the heater 6c is provided under each divided area 60 within the electrostatic chuck 6. By controlling powers of the respective heaters 6c, the control apparatus 200 is capable of controlling temperatures of the respective divided areas 60 independently.

In each divided area 60, at least one temperature sensor 20 is provided at the bottom surface of the electrostatic chuck 6, as depicted in FIG. 4, for example. According to the present exemplary embodiment, a single temperature sensor 20 is provided in each of an area 21a within the divided area 60a, an area 21b within the divided area 60b, an area 21c within the divided area 60c and an area 21d within the divided area 60d, as shown in FIG. 3. Further, a single temperature sensor 20 is provided in an area 21e of the focus ring 5. In the following description, when it is not necessary to distinguish the areas 21a to 21e, they will be referred to as an "area 21" as a general term.

The temperature sensor 20 includes, as shown in FIG. 4, for example, a temperature sensing body 22 and a detecting unit 23. A characteristic of the temperature sensing body 22 is changed depending on a temperature thereof. In the present exemplary embodiment, the temperature sensing body 22 is a fluorescent substance, and the fluorescent characteristic thereof is changed depending on the temperature of the electrostatic chuck 6. The detecting unit 23 is configured to detect the characteristic of the temperature sensing body 22 which is changed depending on the temperature thereof and to output the detecting result to the temperature measuring device 14. According to the present exemplary embodiment, the detecting unit 23 is, by way of example, but not limitation, an optical fiber, and is configured to irradiate pulse light output from the temperature measuring device 14 to the temperature sensing body 22, and transmit light emitted from the temperature sensing body 22 according to the irradiated pulse light to the temperature measuring device 14.

The temperature measuring device 14 is configured to measure the temperature of each divided area 60 based on a signal output from the temperature sensor 20 which is provided in the corresponding divided area 60, and is also configured to output the information of the temperature of the corresponding divided area 60 to the control apparatus 200. By way of non-limiting example, the temperature measuring device 14 transmits the pulse light to the temperature sensing body 22 through the detecting unit 23 and, based on an extinguish rate of the temperature sensing body 22 output from the detecting unit 23, the temperature measuring device 14 measures the temperature of the divided area 60 in which the corresponding temperature sensing body 22 is provided. Further, the temperature measuring device 14 is capable of measuring a temperature of a preset range within a temperature range from −50° C. to 400° C. Further, it is desirable that a temperature resolution of the temperature measuring device 14 is equal to or less than 0.1° C. The temperature sensor 20 and the temperature measuring device 14 are an example of a second temperature measurement unit.

[Processing Apparatus 100 in Calibration Process]

Figure 5:
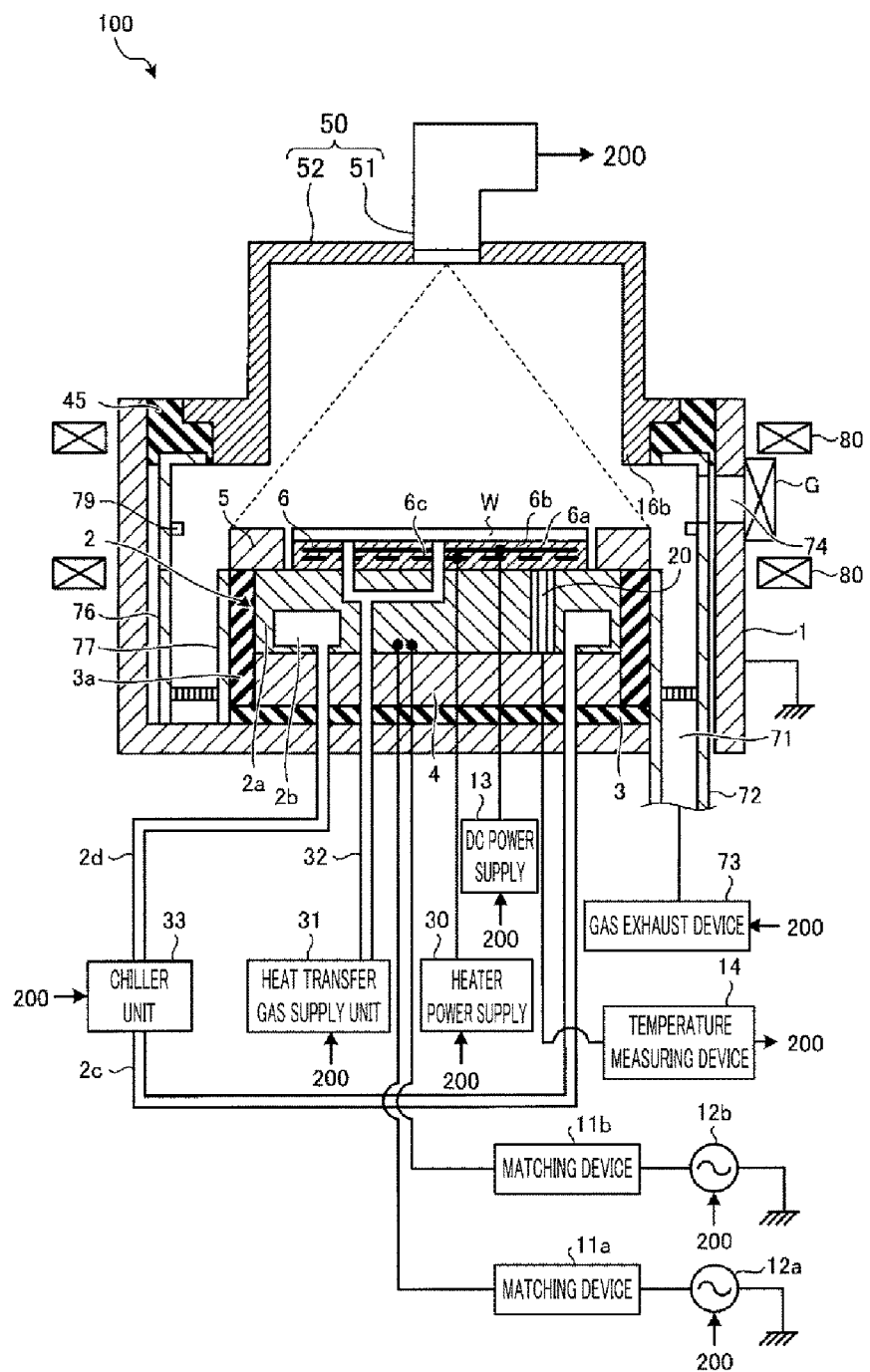
FIG. 5 is a cross sectional view illustrating an example of the processing apparatus during a calibration process.

FIG. 5 is a cross sectional view illustrating an example of the processing apparatus 100 in a calibration process. During the calibration process of the temperature sensor 20, the shower head 16 described with reference to FIG. 1 is separated from the processing chamber 1, and a calibration unit 50 as illustrated in FIG. 5, for example, is mounted to the processing chamber 1.

The calibration unit 50 includes a thermo viewer 51 and a cover member 52. The cover member 52 is configured to support the thermo viewer 51 such that a measurement direction of the thermo viewer 51 is towards the electrostatic chuck 6. In a measurement target area, the thermo viewer 51 measures a temperature of each of minute areas having a preset size from an intensity of light having a preset wavelength range radiated from each minute area. The thermo viewer 51 is also configured to output the measured temperature of each of the minute areas to the control apparatus 200 as a temperature distribution. The thermo viewer 51 is an example of a first temperature measurement unit.

According to the present exemplary embodiment, the thermo viewer 51 is a radiation thermometer configured to measure a temperature of each minute area from an intensity of an infrared ray radiated from the corresponding minute area. In the present exemplary embodiment, the thermo viewer 51 is configured to measure a temperature distribution over the entire top surface of the electrostatic chuck 6 during the calibration process of the temperature sensor 20. According to the exemplary embodiment, the thermo viewer 51 is capable of measuring a temperature of the top surface of the electrostatic chuck 6 in every minute area having a size equal to or less than, for example, 1 mm square. The minute area, the temperature of which is measured by the thermo viewer 51, is smaller than the divided area 60 on the electrostatic chuck 6. The thermo viewer 51 is capable of measuring a temperature of a preset range within a temperature range from −50° C. to +400° C. Further, desirably, a temperature resolution of the thermo viewer 51 is equal to or less than 0.1° C.

[Control Apparatus 200]

Figure 6:
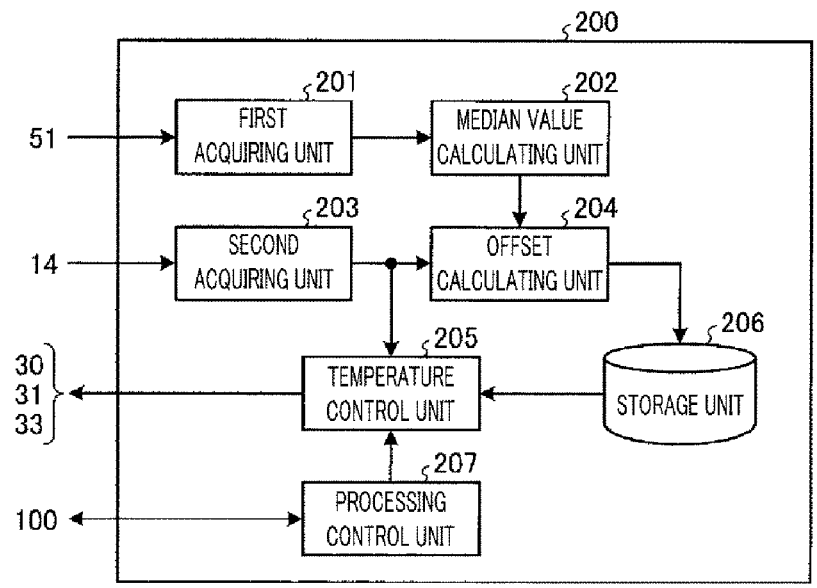
FIG. 6 is a block diagram illustrating an example of a control apparatus.

FIG. 6 is a block diagram illustrating an example of the control apparatus 200. The control apparatus 200 includes, as depicted in FIG. 6, for example, a first acquiring unit 201, a median value calculating unit 202, a second acquiring unit 203, an offset calculating unit 204, a temperature control unit 205, a storage unit 206 and a processing control unit 207.

The first acquiring unit 201 is configured to acquire information of the temperature distribution output from the thermo viewer 51 during the calibration process. The first acquiring unit 201 is also configured to output the acquired information of the temperature distribution to the median value calculating unit 202.

The median value calculating unit 202 is configured to calculate a median value of a temperature distribution range of each divided area 60 on the top surface of the electrostatic chuck 6 based on the information of the temperature distribution output from the first acquiring unit 201 during the calibration process. Further, the median value calculating unit 202 is also configured to output the calculated median value of each divided area 60 to the offset calculating unit 204. By way of example, the median value calculating unit 202 specifies a maximum value and a minimum value of the temperature of each divided area 60 based on the information of the temperature distribution output from the first acquiring unit 201. Then, the median value calculating unit 202 calculates ½ of a sum of the maximum temperature and the minimum temperature as the median value of each divided area 60.

The second acquiring unit 203 is configured to acquire information of the measured temperature of each divided area 60 from the temperature measuring device 14. Further, the second acquiring unit 203 is also configured to output the acquired information of the temperature of each divided area 60 to the offset calculating unit 204 and the temperature control unit 205.

The offset calculating unit 204 is configured to calculate, for each divided area 60, an offset based on the median value output from the median value calculating unit 202 and the information of the temperature output from the second acquiring unit 203. According to the present exemplary embodiment, the offset calculating unit 204 calculates, for each divided area 60, a difference between the temperature output from the second acquiring unit 203 and the median value output from the median value calculating unit 202 as the offset. The offset calculating unit 204 is also configured to store the offset calculated for each divided area 60 in the storage unit 206.

The temperature control unit 205 is configured to control the temperature of each divided area 60 such that the temperature of each divided area 60 output from the second acquiring unit 203 becomes equal to a set temperature output from the processing control unit 207. In the present exemplary embodiment, the temperature control unit 205 controls the temperature of each divided area 60 by controlling the temperature and the flow rate of the coolant by the chiller unit 33, the power of the heater power supply 30 provided in each divided area 60, and so forth. Desirably, the temperature control unit 205 may control the temperature of each divided area 60 with the temperature resolution equal to or less than 0.1° C.

Furthermore, when processing the semiconductor wafer W, the temperature control unit 205 is configured to control the temperature of each divided area 60 by using the temperature information of each divided area 60 obtained by the temperature sensor 20 and output from the second acquiring unit 203, the offset of each divided area 60 stored in the storage unit 206, and the set temperature output from the processing control unit 207. According to the present exemplary embodiment, the control unit 205 controls the temperature of each divided area 60 such that the median value of the temperature distribution range calculated by the median value calculating unit 202 becomes equal to the set temperature output from the processing control unit 207 based on the information of the offset stored in the storage unit 206 and the information of the temperature output from the second acquiring unit 203.

The processing control unit 207 is configured to output the set temperature to the temperature control unit 205 based on a recipe, which is set by an operator of the processing apparatus 100 or the like when the calibration process and the processing on the semiconductor wafer W are performed. Further, the processing control unit 207 is also configured to control individual components of the processing apparatus 100 based on a recipe which is set by the operator of the processing apparatus 100 or the like. Furthermore, it is desirable that the set temperature during the calibration process is equal to the set temperature during the processing of the semiconductor wafer W.

[Offset Calculation]

Figure 7:
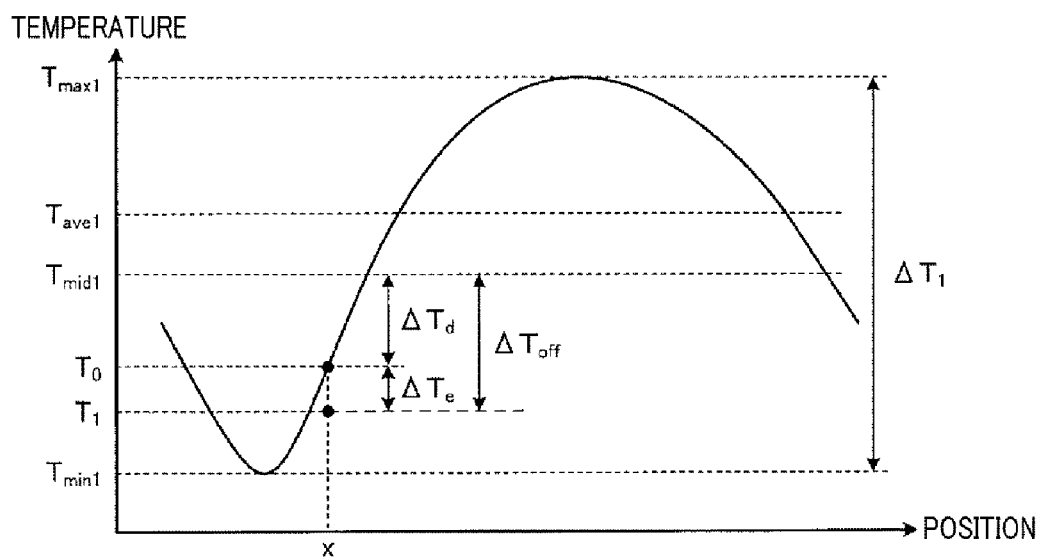
FIG. 7 is a diagram illustrating an example of a temperature distribution of a divided area.

FIG. 7 is a diagram illustrating an example of a temperature distribution of a divided area 60. In the present exemplary embodiment, the calibration is performed in the thermo viewer 51, and FIG. 7 depicts a temperature distribution measured by the thermo viewer 51.

In the temperature distribution illustrated in FIG. 7, $T_{max1}$ denotes a maximum value of the temperature distribution, and $T_{min1}$ refers to a minimum value of the temperature distribution. Further, in the temperature distribution shown in FIG. 7, a median value $T_{mid1}$ is equivalent to ½ of a sum of the maximum value $T_{max1}$ and the minimum value $T_{min1}$. Here, as depicted in FIG. 7, the median value $T_{mid1}$ of the temperature distribution and an average value $T_{ave1}$ of the temperature distribution may not necessarily same.

In the divided area 60 having the temperature distribution shown in FIG. 7, the temperature sensor 20 is provided at a position x. A temperature measured by the temperature sensor 20 before the calibration process is performed includes a measurement error. For this reason, as illustrated in FIG. 7, even if the temperature of the divided area 60 at the position x is $T_0$, the temperature of the divided area 60 may be measured to be $T_1$ by the temperature sensor 20. In this case, there is an error $\Delta T_e$ between the actual temperature $T_0$ of the divided area 60 and the temperature $T_1$ measured by the temperature sensor 20.

Further, the temperature $T_0$ of the divided area 60 at the position x where the temperature sensor 20 is provided does not necessarily equal to the median value $T_{mid1}$ of the temperature distribution range of the divided area 60. Thus, there may be a temperature difference $\Delta T_d$ between the median value $T_{mid1}$ and the temperature $T_0$ of the divided area 60 at the position x.

According to the present exemplary embodiment, the offset calculating unit 204 calculates an offset $\Delta T_{off}$ through the following equation by using the error $\Delta T_e$ and the temperature difference $\Delta T_d$.

$$\Delta T_{off} = \Delta T_d + \Delta T_e = (T_{mid1} - T_0) + (T_0 - T_1) = T_{mid1} - T_1$$

In the present exemplary embodiment, when the processing of the semiconductor wafer W is performed, the temperature control unit 205 adds the offset $\Delta T_{off}$ to the temperature $T_1$ output from the second acquiring unit 203 for each divided area 60, and controls the heater power supply 30 corresponding to each divided area 60 and the like such that the added temperature becomes equal to the set temperature output from the processing control unit 207. Accordingly, the temperature control unit 205 controls the measured temperature $T_1$ of each divided area 60 to be lower than the set temperature by the offset $\Delta T_{off}$. Therefore, in each divided area 60, the median value $T_{mid1}$ of the temperature distribution range is controlled to be equal to the set temperature.

[Temperature Control of Each Divided Area 60]

Figure 8:
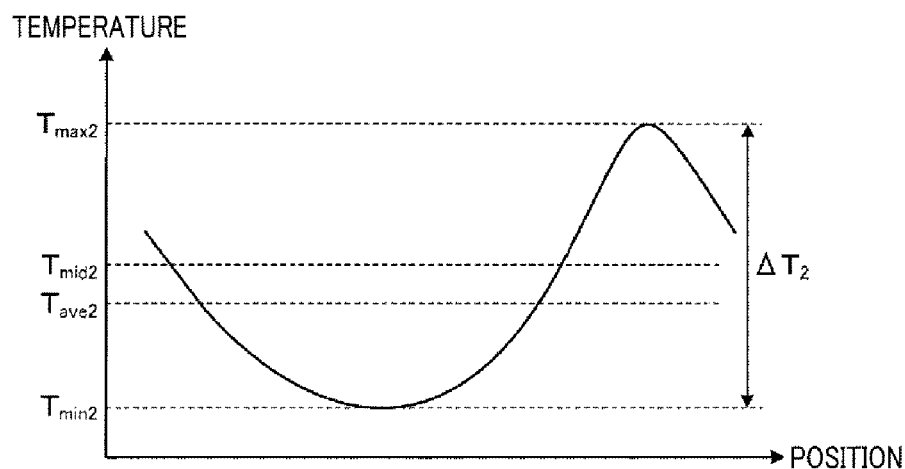
FIG. 8 is a diagram illustrating an example of a temperature distribution of another divided area.

Here, the temperature distributions of the individual divided areas 60 of the electrostatic chuck 6 may not necessarily be same. As illustrated in FIG. 8, for example, it is assumed that the electrostatic chuck 6 has another divided area 60 having a temperature distribution different from that shown in FIG. 7. In the temperature distribution depicted in FIG. 8, an average value $T_{ave1}$ of the temperature distribution is lower than a median value $T_{mid2}$ of the temperature distribution range. Meanwhile, in the temperature distribution depicted in FIG. 7, the average value $T_{ave1}$ of the temperature distribution is higher than the median value $T_{mid1}$ of the temperature distribution range.

Figure 9:
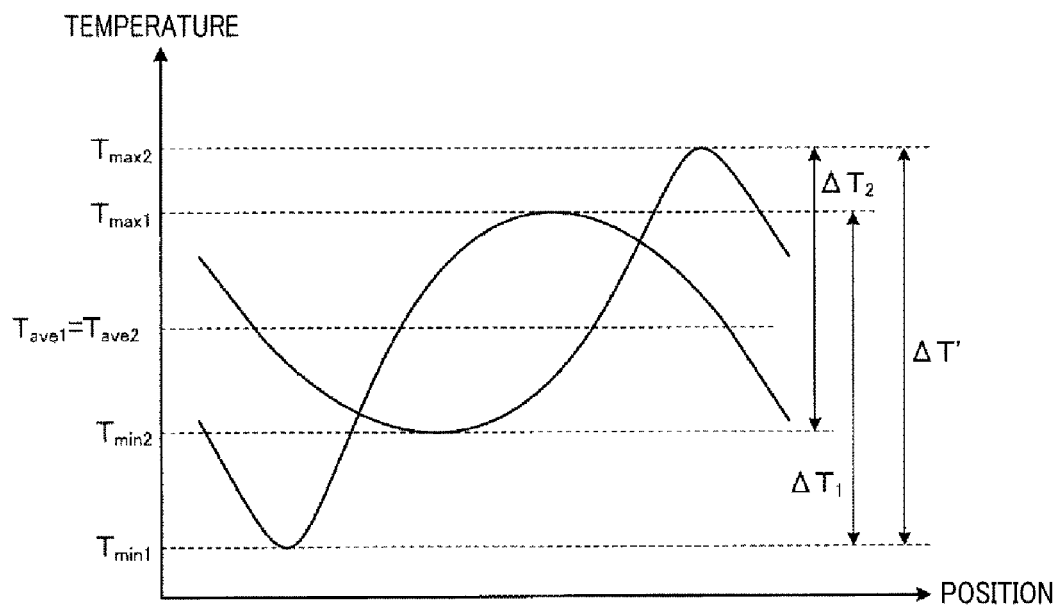
FIG. 9 is a diagram illustrating an example of a temperature distribution range when average values of the temperature distributions are made same.

By way of example, if the temperature of the divided area 60 having the temperature distribution shown in FIG. 7 and the temperature of the divided area 60 having the temperature distribution shown in FIG. 8 are controlled such that the average values of these temperature distributions are same, the temperature distributions of the two divided areas 60 are as depicted in FIG. 9, for example. Referring to FIG. 9, a temperature distribution in the two divided areas 60 is in a range $\Delta T'$ from the minimum value $T_{min1}$ of the temperature distribution shown in FIG. 7 to the maximum value $T_{max2}$ of the temperature distribution depicted in FIG. 8.

Here, for example, if the temperature distribution $\Delta T_1$ shown in FIG. 7 is 0.8° C. and the temperature distribution $\Delta T_2$ shown in FIG. 8 is 0.6° C., the range $\Delta T'$ of the temperature distribution in the two divided areas 60 is equal to or higher than, e.g., 1° C., which is larger than the ranges of both of the temperature distributions $\Delta T_1$ and $\Delta T_2$.

Figure 10:
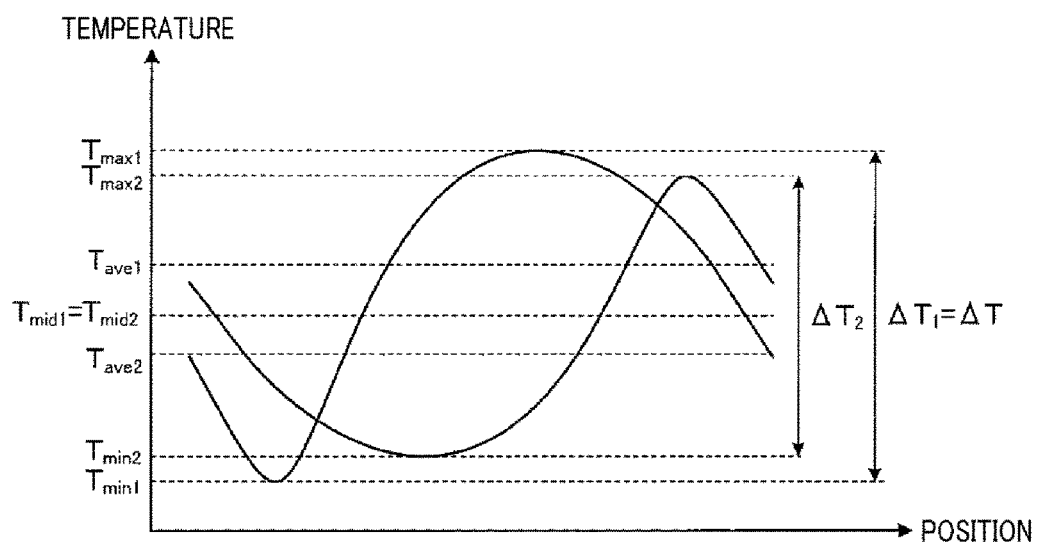
FIG. 10 is a diagram illustrating an example of a temperature distribution range when median values of the temperature distributions are made same.

On the contrary, according to the present exemplary embodiment, the temperature control unit 205 controls the temperature of the divided area 60 having the temperature distribution shown in FIG. 7 and the temperature of the divided area 60 having the temperature distribution shown in FIG. 8 such that the median values of these temperature distributions are same. Accordingly, the temperature distributions of the two divided areas 60 are as depicted in FIG. 10, for example. Referring to FIG. 10, a temperature distribution in the two divided areas 60 is in a range $\Delta T$ from the minimum value $T_{min1}$ of the temperature distribution shown in FIG. 7 to the maximum value $T_{max1}$ of the temperature distribution depicted in FIG. 7.

Here, for example, if the temperature distribution $\Delta T_1$ shown in FIG. 7 is 0.8° C. and the temperature distribution $\Delta T_2$ shown in FIG. 8 is 0.6° C., the range $\Delta T$ of the temperature distribution in the two divided areas 60 becomes equal to the range of the temperature distribution $\Delta T_1$ or $\Delta T_2$ (whichever is wider), for example, 0.8° C. As stated, the temperature control unit 205 controls the temperatures of the respective divided areas 60 such that the median values of the temperature distributions of the respective divided areas 60 are same, so that the range of the temperature distribution in the whole of the divided areas 60 can be narrowed. Accordingly, the processing system 10 is capable of improving temperature uniformity over the entire surface of the semiconductor wafer W which is mounted on the electrostatic chuck 6.

Especially, if the range of the temperature distribution of each divided area 60 is equal to or less than 1° C., the temperature control unit 205 is capable of suppressing the range of the temperature distribution in the whole of the divided areas 60 to be 1° C. or less. Further, the temperature control unit 205 controls the temperature of each divided area 60 such that the median value of the temperature distribution of each divided area 60 reaches the set temperature. Accordingly, in the temperature distribution on the electrostatic chuck 6, a difference between the set temperature and a temperature most deviated from the set temperature can be reduced.

[Operation in Calibration Process]

Figure 11:
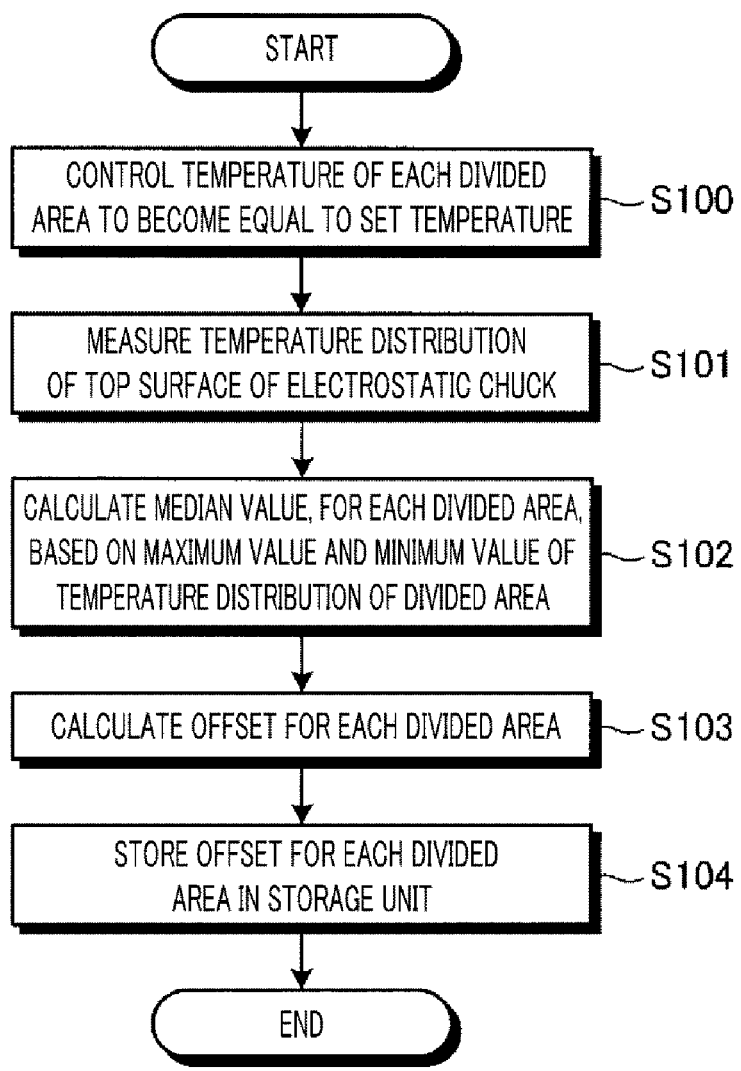
FIG. 11 is a flowchart for describing an example operation of the control apparatus during the calibration process.

FIG. 11 is a flowchart illustrating an example of an operation of the control apparatus 200 when a calibration process is performed. The calibration unit 50 is mounted to the processing chamber 1 instead of, for example, the shower head 16. Then, in response to an instruction from the operator instructing that the calibration process be performed, the control apparatus 200 starts the operation depicted in the flowchart of FIG. 11.

First, the processing control unit 207 controls the individual components of the processing apparatus 100 based on the recipe in which the internal pressure of the processing chamber 1 during the calibration process and the like is specified. Then, the processing control unit 207 outputs a set temperature for the calibration process to the temperature control unit 205. The temperature control unit 205 controls the heater power supply 30 or the like such that a temperature of each divided area 60 measured by the temperature sensor 20 reaches the set temperature output from the processing control unit 207 based on the information of the temperature output from the second acquiring unit 203 (S100).

Subsequently, the first acquiring unit 201 allows the thermo viewer 51 to measure a temperature distribution on the top surface of the electrostatic chuck 6, and acquires information of the temperature distribution from the thermo viewer 51 (S101). Thereafter, the first acquiring unit 201 outputs the acquired information of the temperature distribution to the median value calculating unit 202.

Then, the median value calculating unit 202 specifies a maximum value and a minimum value of the temperature of each divided area 60 based on the information of the temperature distribution output from the first acquiring unit 201. Then, for each divided area 60, the median value calculating unit 202 calculates ½ of a sum of the maximum value and the minimum value as a median value of the range of the temperature distribution (S102).

Subsequently, for each divided area 60, the offset calculating unit 204 calculates a difference between the temperature measured by the temperature sensor 20 and the median value output from the median value calculating unit 202 as an offset (S103). Then, the offset calculating unit 204 stores the offset of each divided area 60 in the storage unit 206 (S104). Then, the control apparatus 200 ends the operation described in the flowchart of FIG. 11.

By way of example, if the set temperature for the calibration process is 60° C., the temperature control unit 205 controls the heater 6c provided in each divided area 60 such that the temperature of each divided area measured by the temperature sensor 20 reaches 60° C. If the maximum value $T_{max1}$ and the minimum value $T_{min1}$ of the temperature distribution of the certain divided area 60 are 65° C. and 59° C., respectively, the median value calculating unit 202 calculates 62° C. as the median value $T_{mid1}$ of the temperature distribution of the corresponding divided area 60. Further, since the temperature measured by the temperature sensor 20 is controlled to be 60° C. by the temperature control unit 205, the temperature $T_1$ measured by the temperature sensor 20 becomes equal to 60° C. Then, the offset calculating unit 204 calculates $T_{mid1}-T_1=62-60=+2°$ C. as the offset $\Delta T_{off}$. Further, in case that the temperature $T_1$ measured by the temperature sensor 20 is higher than the median value $T_{min1}$, the offset $\Delta T_{off}$ has a minus value.

After the offset is calculated in the process S103, the temperature control unit 205 performs a control such that a temperature calculated by adding the offset to the temperature of each divided area 60 measured by the temperature sensor 20 becomes equal to the set temperature output from the processing control unit 207, and the median value calculating unit 202 calculates the median value of the temperature distribution of each divided area 60 based on the information of the temperature distribution output from the first acquiring unit 201. Further, for each divided area 60, the processing control unit 207 may determine whether a difference between the median value of the temperature distribution and the set temperature is smaller than a preset value (e.g., 0.1° C.). If the difference between the median value of the temperature distribution and the set temperature is below the preset value in all of the divided areas 60, the control apparatus 200 ends the operation shown in FIG. 11. Meanwhile, if there is any divided area 60 where the difference between the median value of the temperature distribution and the set temperature is equal to or larger than the preset value, the control apparatus 200 may perform the operation shown in FIG. 11 again, starting from process S100.

[Operation in Processing of Semiconductor Wafer W]

Figure 12:
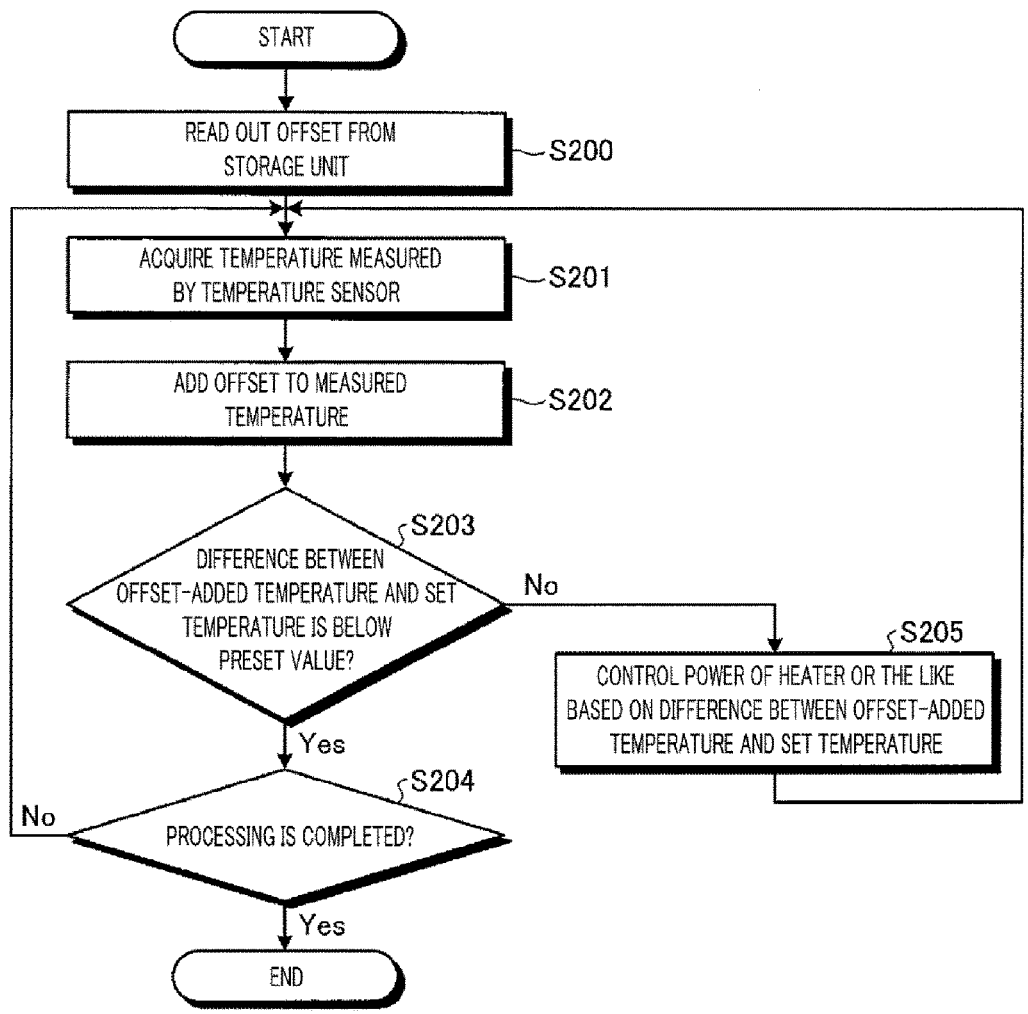
FIG. 12 is a flowchart for describing an example operation of the control apparatus when a process on a semiconductor wafer is performed.

FIG. 12 is a flowchart illustrating an example of an operation of the control apparatus 200 when a processing on the semiconductor wafer W is performed. After the semiconductor wafer W is loaded into the processing apparatus 100 shown in FIG. 2, for example, the control apparatus 200 begins the operation shown in the flowchart of FIG. 12 in response to an instruction from the operator instructing that the processing on the semiconductor wafer W be performed.

Further, FIG. 12 depicts the operation of the control apparatus 200 for a single divided area 60. Thus, the control apparatus 200 performs the operation shown in FIG. 12 for each of the divided areas 60. Moreover, in FIG. 12, the operation of the control apparatus 200 regarding a temperature control of the semiconductor wafer W is described, and a control of a pressure within the processing chamber 1, a control of a high frequency power applied to the mounting table 2, a control of a flow rate of a processing gas, and so forth are controlled by control signals sent from the processing control unit 207 to the processing apparatus 100 according to the processing recipe.

First, the processing control unit 207 outputs a set temperature for the processing of the semiconductor wafer W to the temperature control unit 205 based on the processing recipe. The temperature control unit 205 reads out the offset of the divided area 60 from the storage unit 206 (S200). Then, the temperature control unit 205 acquires information of a temperature measured by the temperature sensor 20 from the second acquiring unit 203 (S201).

Thereafter, the temperature control unit 205 adds the offset, which is read out in the process S200, to the temperature measured by the temperature sensor 20 (S202). Then, the temperature control unit 205 determines whether a difference between the offset-added temperature (i.e., the temperature to which the offset is added) and the set temperature output from the processing control unit 207 is below a preset value (e.g., 0.1° C.) (S203).

If the difference between the offset-added temperature and the set temperature output from the processing control unit 207 is equal to or larger than the preset value (S203; No), the temperature control unit 205 controls the heater power supply 30 and so forth based on the difference between the offset-added temperature and the set temperature output from the processing control unit 207 (S205). Then, the temperature control unit 205 performs the process S201 again.

Meanwhile, if the difference between the offset-added temperature and the set temperature output from the processing control unit 207 is smaller than the preset value (S203; Yes), the processing control unit 207 determines whether the processing of the semiconductor wafer W is finished, based on the processing recipe. In case that the processing of the semiconductor wafer W is not completed (S204; No), the temperature control unit 205 performs the process S201 again. Meanwhile, in case that the processing of the semiconductor wafer W is completed (S204; Yes), the control apparatus 200 ends the operations depicted in the flowchart of FIG. 12.

For example, in the divided area 60 having the temperature distribution of FIG. 7, if the offset $\Delta T_{off}$ is +2° C. and the set temperature for the processing of the semiconductor wafer W is 60° C., the temperature control unit 205 adds the offset $\Delta T_{off}$, i.e., +2° C. to the temperature $T_1$ measured by the temperature sensor 20 provided in this divided area 60. The temperature control unit 205 controls a power of the heater 6c provided in this divided area 60 such that the sum of $T_1$+2° C. becomes equal to the set temperature, i.e., 60° C.

Accordingly, the overall temperature distribution of the corresponding divided area 60 is controlled to be lower than the set temperature by the offset $\Delta T_{off}$ (i.e., +2° C.), for example, controlled to be 58° C. Accordingly, the median value $T_{mid1}$ of the temperature distribution range becomes 60° C., and the median value $T_{mid1}$ is made to be equal to the set temperature. Further, as the temperature control unit 205 controls the power of the heater 6c of each divided area 60 such that the sum of the temperature measured by the temperature sensor 20 of each divided area 60 and the offset becomes equal to the set temperature, so that the median value of the temperature distribution of each divided area 60 can be made to approach the set temperature.

Furthermore, if the offset $\Delta T_{off}$ has a minus value, the temperature control unit 205 controls the temperature of the corresponding divided area 60 such that the overall temperature distribution becomes higher than the set temperature by the offset $\Delta T_{off}$. For example, if the set temperature is 60° C. and the offset $\Delta T_{off}$ is −2° C., the temperature control unit 205 controls the temperature of the divided area 60 such that the temperature distribution of this divided area 60 becomes 62° C., which is higher than 60° C. by 2° C.

In the above, the exemplary embodiments have been described. According to the processing system 10 of the present exemplary embodiments, the temperature uniformity over the entire surface of the semiconductor wafer W can be improved.

[Hardware of Control Apparatus 200]

Figure 13:
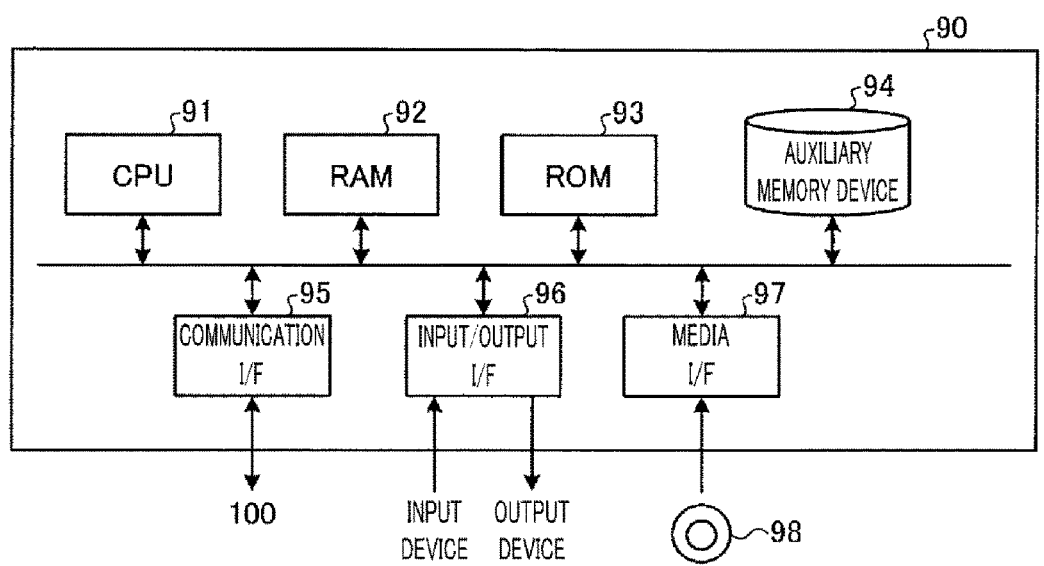
FIG. 13 is a diagram illustrating an example of a computer configured to implement a function of the control apparatus.

The control apparatus 200 according to the above-described exemplary embodiments may be implemented by a computer 90 as illustrated in FIG. 13, for example. FIG. 13 is a diagram showing an example of the computer 90 configured to perform the operations of the control apparatus 200. The computer 90 includes a CPU (Central Processing Unit) 91, a RAM (Random Access Memory) 92, a ROM (Read Only Memory) 93, an auxiliary memory device 94, a communication interface (I/F) 95, an input/output interface (I/F) 96 and a media interface (I/F) 97.

The CPU 91 is operated based on a program stored in the ROM 93 or the auxiliary memory device 94 and is configured to control the individual components of the apparatus. The ROM 93 is configured to store therein a boot program executed by the CPU 91 at the time of starting the computer 90, a program dependent on the hardware of the computer 90, and so forth.

The auxiliary memory device 94 is implemented by, for example, a HDD (Hard Disk Drive), a SSR (Solid State Drive), or the like, and is configured to store therein a program executed by the CPU 91, data used by this corresponding program, and so forth. The CPU 91 is configured to read the corresponding program from the auxiliary memory device 94, load the program onto the RAM 92 and execute the loaded program.

The communication I/F 95 is configured to communicate with the processing apparatus 100 through a communication line such as a LAN (Local Area Network). Specifically, the communication I/F 95 is configured to receive data from the processing apparatus 100, send the received data to the CPU 91 and output data generated by the CPU 91 to the processing apparatus 100 through the communication line.

The CPU 91 is also configured to control an input device such as a keyboard and an output device such as a display through the input/output I/F 96. Specifically, the CPU 91 is configured to acquire a signal input from the input device and send the acquired signal to the CPU 91 through the input/output I/F 96. Further, the CPU 91 is further configured to output the data generated by the CPU 91 to the output device through the input/output I/F 96.

The media I/F 97 is configured to read a program or data stored in a recording medium 98 and store the program or the data in the auxiliary memory device 94. The recording medium 98 may be implemented by, for example, but not limitation, an optical recording medium such as a DVD (Digital Versatile Disc) or a PD (Phase change rewritable Disk), a magneto-optical recording medium such as a MO (Magneto-Optical disk), a tape medium, a magnetic recording medium, a semiconductor memory, or the like.

The CPU 91 of the computer 90 performs the operations of the first acquiring unit 201, the median value calculating unit 202, the second acquiring unit 203, the offset calculating unit 204, the temperature control unit 205, the storage unit 206 and the processing control unit 207 by executing the program loaded on the RAM 92. Further, the data in the storage unit 206 is also stored in the auxiliary memory device 94.

The CPU 91 of the computer 90 is configured to read the program, which is loaded onto the RAM 92, from the recording medium 98 and store the program in the auxiliary memory device 94. As another example, the program may be acquired from another apparatus through a communication line and stored in the auxiliary memory device 94.

The above-described exemplary embodiments are not limiting, and various changes and modifications may be without departing from the scope of the subject matter described herein.

By way of example, in the above-described exemplary embodiments, the thermo viewer 51 is configured to measure the temperature distribution over the top surface of the electrostatic chuck 6 during the calibration process. However, the exemplary embodiments are not limited thereto. By way of example, during the calibration process, the thermo viewer 51 may measure a temperature distribution over a top surface of the semiconductor wafer W placed on the electrostatic chuck 6. In this configuration, the thermo viewer 51 is capable of measuring a temperature distribution closer to the temperature distribution on the semiconductor wafer W which is actually processed. Further, in case that the semiconductor wafer W is made of silicon, an infrared ray is transmitted through the silicon. Therefore, if the thermo viewer 51 is a radiation thermometer using an infrared ray, it is difficult to measure the temperature distribution on the semiconductor wafer W by the thermo viewer 51. Thus, in case that the semiconductor wafer W is made of silicon, the temperature distribution on the semiconductor wafer W is measured by the thermo viewer 51 by using the semiconductor wafer W colored with, for example, black.

Further, the calibration process according to the above-described exemplary embodiments may be performed whenever a preset number of semiconductor wafers W is processed. Further, the operator or the like may monitor the calculated offset whenever the calibration process is performed, so that a change in the processing apparatus 100 with the lapse of time can be monitored.

Furthermore, in the above-described exemplary embodiment, the control apparatus 200 calculates the offset of each divided area 60 based on the temperature distribution on the top surface of the electrostatic chuck 6 which is measured by the thermo viewer 51. However, the exemplary embodiment is not limited thereto. By way of non-limiting example, the temperature distribution of each divided area 60 may be measured by using a semiconductor wafer W for temperature distribution measurement, which is equipped with temperature sensors provided at plural positions thereon. In such a case, each temperature sensor transmits, to the control apparatus 200 by wireless communication, information of a temperature at the position where the temperature sensor is provided. The first acquiring unit 201 of the control apparatus 200 specifies the temperature at each position of the semiconductor wafer W as the temperature distribution by using the information of the temperature sent from each temperature sensor. By using the semiconductor wafer W for an actual processing as the semiconductor wafer W at which the temperature sensors are provided, it is possible to measure the temperature distribution on the semiconductor wafer W in an environment similar to the actual processing environment. Hence, the temperature uniformity over the surface of the semiconductor wafer W can be further improved.

Furthermore, in the above-described exemplary embodiment, when performing the processing of the semiconductor wafer W, the temperature control unit 205 controls the power of the heater 6c of each divided area 60 such that the sum of the temperature measured by the temperature sensor 20 and the offset becomes the set temperature. However, the exemplary embodiment may not be limited thereto. For instance, when performing the processing of the semiconductor wafer W, the temperature control unit 205 may control the power of the heater 6c of each divided area 60 such that the temperature of each divided area 60 measured by the temperature sensor 20 becomes a temperature calculated by subtracting the offset from the set temperature.

Furthermore, in the above-described exemplary embodiment, the temperature sensor 20 provided in each divided area 60 is configured to measure the temperature of each divided area 60 based on, for example, the extinguish rate of the fluorescent substance, whose fluorescence characteristic is changed depending on the temperature thereof. However, the exemplary embodiment is not limited thereto. The temperature sensor 20 provided in each divided area 20 may be implemented by, for example, but not limitation, a thermocouple or the like as long as it is a sensor configured to measure the temperature of the divided area 60.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A temperature control apparatus of controlling a temperature of a processing target object, the temperature control apparatus comprising:
    a first temperature measurement unit configured to measure a temperature distribution over an entire top surface of the processing target object;
    a second temperature measurement unit configured to measure, for each of preset divided areas into which the entire top surface of the processing target object is divided, an initial temperature of a portion in the each of preset divided areas;
    a median value calculating unit configured to calculate, for each divided area, a median value of a temperature distribution of the each divided area, based on the temperature distribution over the entire top surface of the processing target object measured by the first temperature measurement unit;
    an offset calculating unit configured to calculate, for each divided area, an offset value by calculating a difference between the calculated median value, and the initial temperature of the top surface of the processing target object in the portion; and
    a temperature control unit configured to control, for each divided area, a temperature of the each divided area such that a median value for controlled temperature becomes equal to a set temperature for processing of the processing target object, wherein the median value for controlled temperature is obtained based on the calculated offset value and the temperature of the each divided area measured by the second temperature measurement unit.

2. The temperature control apparatus of claim 1,
wherein the first temperature measurement unit is configured to measure, as the temperature distribution over the entire top surface of the processing target object, a temperature distribution of an entire area in a mounting surface of a mounting table on which the processing target object is mounted.

3. The temperature control apparatus of claim 2,
wherein the mounting table is configured to mount the processing target object thereon, and comprises an electrostatic attraction unit configured to attract and hold the processing target object by an electrostatic force.

4. The temperature control apparatus of claim 1,
wherein the temperature control unit is configured to control, for each divided area, the temperature of the each divided area such that a temperature calculated by adding the offset value to the temperature of the each divided area measured by the second temperature measurement unit becomes equal to the set temperature.

5. The temperature control apparatus of claim 1,
wherein the temperature control unit is configured to control, for each divided area, the temperature of the each divided area such that the temperature of the each divided area measured by the second temperature measurement unit becomes equal to a temperature calculated by subtracting the calculated offset value from the set temperature.

6. The temperature control apparatus of claim 1,
wherein the first temperature measurement unit is configured to divide the top surface of the processing target object into minute areas smaller than the preset divided areas and configured to measure a temperature of each minute area, based on an intensity of light having a preset wavelength range radiated from the each minute area.

7. The temperature control apparatus of claim 6,
wherein the each minute area has a size equal to or less than 1 mm square on the top surface of the processing target object.

8. The temperature control apparatus of claim 1,
wherein the first temperature measurement unit is allowed to measure a temperature of a preset range within a temperature range from −50° C. to +400° C.

9. The temperature control apparatus of claim 1,
wherein the second temperature measurement unit is implemented by a thermocouple.

10. The temperature control apparatus of claim 1,
wherein the first temperature measurement unit and the second temperature measurement unit have a temperature measurement resolution of 0.1° C. or less.

11. The temperature control apparatus of claim 1,
wherein the temperature control unit has a temperature control resolution of 0.1° C. or less.

12. A temperature control method of controlling a temperature of a processing target object, the temperature control method comprising:
measuring a temperature distribution over an entire top surface of the processing target object;
measuring, for each of preset divided areas into which the top surface of the processing target object is divided, an initial temperature of a portion in the each of preset divided areas;
calculating, for each divided area, a median value of a temperature distribution of the each divided area, based on the temperature distribution over the entire top surface of the processing target object;
calculating, for each divided area, a difference between the calculated median value and the measured initial temperature of the top surface of the processing target object in the portion, as an offset value; and
controlling, for each divided area, a temperature of the each divided area such that a median value for controlled temperature becomes equal to a set temperature for processing of the processing target object, wherein the median value for controlled temperature is obtained based on the offset value and the temperature of the divided area.

13. A temperature control apparatus of controlling a temperature of a processing target object, the temperature control apparatus comprising:
a first thermometer configured to measure a temperature distribution over an entire top surface of the processing target object;
a second thermometer configured to measure, for each of preset divided areas into which the entire top surface of the processing target object is divided, an initial temperature of a portion in the each of preset divided areas; and
at least one processor configured to:
calculate, for each divided area, a median value of a temperature distribution of the each divided area, based on the temperature distribution over the entire top surface of the processing target object measured by the first thermometer,
calculate, for each divided area, an offset value by calculating a difference between the calculated median value, and the initial temperature of the top surface of the processing target object in the portion, and
control, for each divided area, a temperature of the each divided area such that a median value for controlled temperature becomes equal to a set temperature for processing of the processing target object, wherein the median value for controlled temperature is obtained based on the calculated offset value and the temperature of the each divided area measured by the second thermometer.

14. The temperature control apparatus of claim 13,
wherein the first thermometer is configured to measure, as the temperature distribution over the entire top surface of the processing target object, a temperature distribution of an entire area in a mounting surface of a mounting table on which the processing target object is mounted.

15. The temperature control apparatus of claim 14,
wherein the mounting table is configured to mount the processing target object thereon, and comprises an electronic chuck configured to attract and hold the processing target object by an electrostatic force.

16. The temperature control apparatus of claim 13,
wherein the at least one processor is configured to control, for each divided area, the temperature of the each divided area such that a temperature calculated by adding the offset value to the temperature of the each divided area measured by the second thermometer becomes equal to the set temperature.

17. The temperature control apparatus of claim 13,
wherein the at least one processor is configured to control, for each divided area, the temperature of the each divided area such that the temperature of the each divided area measured by the second thermometer becomes equal to a temperature calculated by subtracting the calculated offset value from the set temperature.

18. The temperature control apparatus of claim 13,
wherein the first thermometer is configured to divide the top surface of the processing target object into minute areas smaller than the preset divided areas and configured to measure a temperature of each minute area, based on an intensity of light having a preset wavelength range radiated from the each minute area.

19. The temperature control apparatus of claim 18,
wherein the each minute area has a size equal to or less than 1 mm square on the top surface of the processing target object.

* * * * *